United States Patent
Koshi et al.

(10) Patent No.: US 9,349,915 B2
(45) Date of Patent: May 24, 2016

(54) β-GA$_2$O$_3$-BASED SINGLE CRYSTAL SUBSTRATE

(71) Applicants: TAMURA CORPORATION, Tokyo (JP); KOHA CO., LTD., Tokyo (JP)

(72) Inventors: Kimiyoshi Koshi, Tokyo (JP); Shinya Watanabe, Tokyo (JP); Masaru Takizawa, Tokyo (JP); Yu Yamaoka, Tokyo (JP); Daiki Wakimoto, Tokyo (JP); Makoto Watanabe, Tokyo (JP)

(73) Assignees: TAMURA CORPORATION, Tokyo (JP); KOHA CO., LTD., Tokyo (JP)

( * ) Notice: Subject to any disclaimer, the term of this patent is extended or adjusted under 35 U.S.C. 154(b) by 0 days.

(21) Appl. No.: 14/633,106

(22) Filed: Feb. 26, 2015

(65) Prior Publication Data
US 2015/0249185 A1 Sep. 3, 2015

(30) Foreign Application Priority Data
Feb. 28, 2014 (JP) ................. 2014-039782

(51) Int. Cl.
| | |
|---|---|
| *B32B 3/00* | (2006.01) |
| *H01L 33/16* | (2010.01) |
| *C30B 15/34* | (2006.01) |
| *C30B 29/16* | (2006.01) |
| *H01L 33/02* | (2010.01) |

(52) U.S. Cl.
CPC ............. *H01L 33/16* (2013.01); *C30B 15/34* (2013.01); *C30B 29/16* (2013.01); *H01L 33/02* (2013.01); *Y10T 428/21* (2015.01)

(58) Field of Classification Search
CPC ......... C30B 29/16; C30B 15/34; H01L 33/16; Y10T 428/21
See application file for complete search history.

(56) References Cited

U.S. PATENT DOCUMENTS

| | | | |
|---|---|---|---|
| 2006/0150891 A1* | 7/2006 | Ichinose | C30B 23/02 117/2 |
| 2014/0352604 A1* | 12/2014 | Koshi | C30B 15/34 117/26 |
| 2015/0125717 A1* | 5/2015 | Galazka | C30B 11/00 428/697 |

FOREIGN PATENT DOCUMENTS

| | | |
|---|---|---|
| JP | 2013-103864 A | 5/2013 |
| JP | 2013-237591 A | 11/2013 |

OTHER PUBLICATIONS

"Growth of β-Ga$_2$O$_3$ Single Crystals by the Edge-Defined, Film Fed Growth Method," H. Aida, et al., Japanese Journal of Applied Physics, vol. 47, No. 11, 2008, pp. 8506-8509.

"β-Ga$_2$O$_3$ Schottky Barrier Diodes Fabricated by Using Single-Crystal β-Ga$_2$O$_3$ (010) Substrates," K. Sasaki, et al., IEEE Electron Device Letters, vol. 34, No. 4, 2013, pp. 493-495.

(Continued)

*Primary Examiner* — Elizabeth Mulvaney
(74) *Attorney, Agent, or Firm* — McGinn IP Law Group, PLLC.

(57) ABSTRACT

A β-Ga$_2$O$_3$-based single crystal substrate includes a β-Ga$_2$O$_3$-based single crystal. The β-Ga$_2$O$_3$-based single crystal includes a full width at half maximum of an x-ray rocking curve of less than 75 seconds.

13 Claims, 9 Drawing Sheets

(56) References Cited

OTHER PUBLICATIONS

Japanese Office Action dated Jan. 6, 2015.
Japanese Office Action dated Jan. 6, 2015 with a partial English translation thereof.
Partial Extended European Search Report dated Aug. 28, 2015.

Suzuki N., et al.: "Fabrication and Characterization of Transparent Conductive Sn-Doped β-Ga2O3 Single Crystal", Physica Status Solidi (C) Wiley-VCH Verlag GmbH Germany, vol. 4, No. 7, May 31, 2007, pp. 2310-2313, XP002743447, ISSN: 1862-6351.
Zbigniew Galazka et al: "On the Bulk β-Ga2O3 Single Crystals Grown by the Czochralski Method", Journal of Crystal Growth, vol. 404, Oct. 1, 2014, pp. 184-191, XP055166284, ISSN: 0022-0248.

* cited by examiner

1 β-Ga₂O₃-BASED SINGLE CRYSTAL SUBSTRATE

3 TWINNING PLANE

β-GA₂O₃-BASED SINGLE CRYSTAL SUBSTRATE

The present application is based on Japanese patent application No. 2014-039782 filed on Feb. 28, 2014, the entire contents of which are incorporated herein by reference.

BACKGROUND OF THE INVENTION

1. Field of the Invention

The invention relates to a β-Ga₂O₃-based single crystal substrate.

2. Description of the Related Art

To grow a β-Ga₂O₃ single crystal by EFG method is known (see, e.g., a non-patent literature: "Growth of β-Ga₂O₃ Single Crystals by the Edge-Defined Film Fed Growth Method" by Hideo Aida, Kengo Nishiguchi, Hidetoshi Takeda, Natsuko Aota, Kazuhiko Sunakawa, Yoichi Yaguchi, Japanese Journal of Applied Physics, Volume 47, No. 11, pp. 8506-8509 (2008)). The non-patent literature discloses a method that a β-Ga₂O₃ single crystal is grown while gradually broadening a width thereof from a contact portion with a seed crystal toward the bottom, i.e., while broadening the shoulder in a width direction, thereby allowing a plate-shaped crystal having a larger width than the seed crystal to be obtained.

Also, the non-patent literature discloses that the grown β-Ga₂O₃ single crystal is 75 seconds in full width at half maximum (FWHM) of x-ray rocking curve and $9 \times 10^4$ cm$^{-2}$ in pit density.

SUMMARY OF THE INVENTION

No high quality-worth gallium oxide single crystals have been produced so far. In addition, the conventional technique only can produce the gallium oxide single crystals with such a low quality as disclosed in the non-patent literature, and it is still unknown whether or not there is any method to produce a higher-quality gallium oxide single crystal.

It is an object of the invention to provide a β-Ga₂O₃-based single crystal substrate with an excellent crystal quality.

According to one embodiment of the invention, a β-Ga₂O₃-based single crystal substrate as set forth in [1] to [10] below is provided.

[1] A β-Ga₂O₃-based single crystal substrate, comprising a β-Ga₂O₃-based single crystal,
wherein the β-Ga₂O₃-based single crystal comprises a full width at half maximum of an x-ray rocking curve of less than 75 seconds.

[2] The β-Ga₂O₃-based single crystal substrate according to [1], wherein the full width at half maximum of x-ray rocking curve is obtained at a (−201) plane or a (001) plane of the β-Ga₂O₃-based single crystal.

[3] The β-Ga₂O₃-based single crystal substrate according to [1] or [2], wherein the 3-Ga₂O₃-based single crystal comprises a main surface with a plane orientation of (−201), (101) or (001).

[4] The β-Ga₂O₃-based single crystal substrate according to one of [1] to [3], wherein the full width at half maximum is not more than 35 seconds.

[5] A β-Ga₂O₃-based single crystal substrate, comprising an average dislocation density of less than $9 \times 10^4$ cm$^{-2}$.

[6] The β-Ga₂O₃-based single crystal substrate according to [5], wherein the average dislocation density is not more than $7.8 \times 10^4$ cm$^{-2}$.

[7] The β-Ga₂O₃-based single crystal substrate according to [5] or [6], further comprising a main surface with a plane orientation of (−201), (101) or (001).

[8] The 3-Ga₂O₃-based single crystal substrate according to one of [1] to [7], wherein the substrate is free from any twinned crystal.

[9] The β-Ga₂O₃-based single crystal substrate according to one of [1] to [8], wherein the substrate further comprises a diameter of not less than 2 inches.

[10] The β-Ga₂O₃-based single crystal substrate according to one of [1] to [7], further comprising a region free from any twinning plane, and wherein the region comprises a maximum width of not less than 2 inches in a direction perpendicular to an intersection line between a twinning plane and a main surface.

Effects of the Invention

According to one embodiment of the invention, a β-Ga₂O₃-based single crystal substrate with an excellent crystal quality can be provided.

BRIEF DESCRIPTION OF THE DRAWINGS

Next, the present invention will be explained in more detail in conjunction with appended drawings, wherein.

DETAILED DESCRIPTION OF THE PREFERRED EMBODIMENTS

First Embodiment

Configuration of β-Ga₂O₃-Based Single Crystal Substrate

Figure 1A:
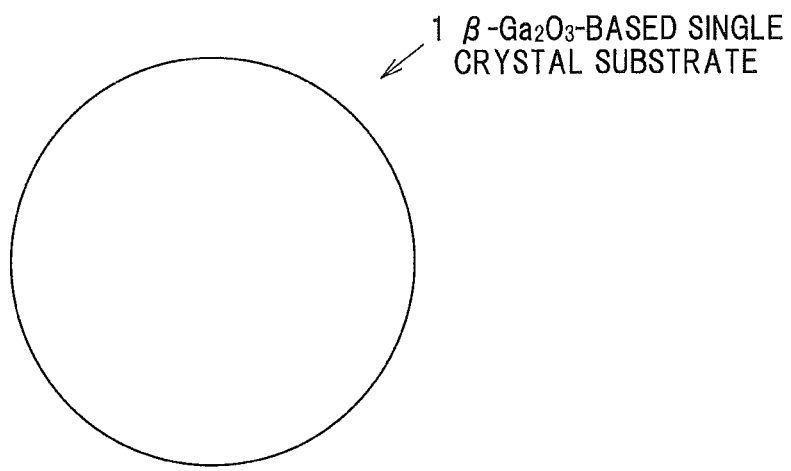
FIGS. 1A and 1B are plan views showing β-Ga₂O₃-based single crystal substrates in a first embodiment.
Figure 1B:
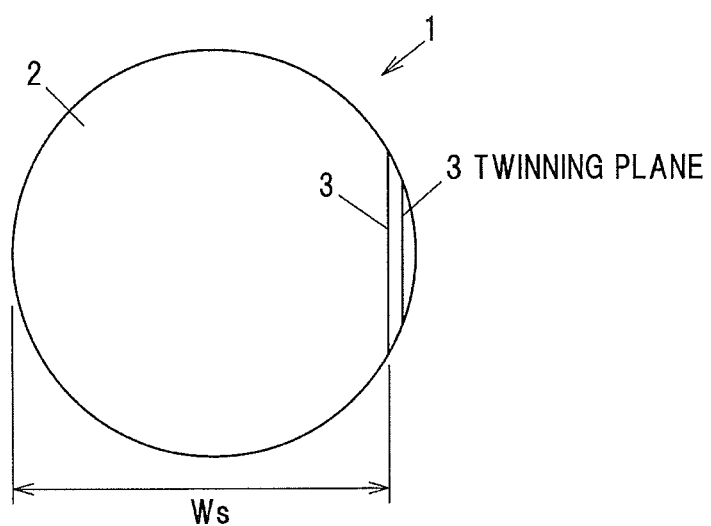

FIGS. 1A and 1B are plan views showing β-Ga₂O₃-based single crystal substrates 1 in the first embodiment. FIG. 1A shows a β-Ga₂O₃-based single crystal substrate 1 without twins and FIG. 1B shows a β-Ga₂O₃-based single crystal substrate 1 with a few twins.

The β-Ga₂O₃-based single crystal substrate 1 is formed of a β-Ga₂O₃-based single crystal. The β-Ga₂O₃-based single crystal here is a β-Ga$_2$O$_3$ single crystal, or a β-Ga$_2$O$_3$ single crystal doped with an element such as Mg, Fe, Cu, Ag, Zn, Cd, Al, In, Si, Ge, Sn or Nb.

The β-Ga$_2$O$_3$-based crystal has a β-gallia structure belonging to the monoclinic system and typical lattice constants of the β-Ga$_2$O$_3$ crystal not containing impurities are a$_0$=12.23 Å, b$_0$=3.04 Å, c$_0$=5.80 Å, α=γ=90° and β=103.8°.

The orientation of a main surface of the β-Ga$_2$O$_3$-based single crystal substrate 1 is not limited to a specific orientation and is, e.g., (−201), (101) or (001).

A diameter of the β-Ga$_2$O$_3$-based single crystal substrate 1 without twins shown in FIG. 1A is preferably not less than 2 inches. The β-Ga$_2$O$_3$-based single crystal substrate 1 is cut from a β-Ga$_2$O$_3$-based single crystal which is grown by a below-described new method and does not contain or hardly contains twins. Therefore, it is possible to cut out a large substrate of not less than 2 inches not containing twins as the β-Ga$_2$O$_3$-based single crystal substrate 1.

The β-Ga$_2$O$_3$-based single crystal has high cleavability on a (100) plane, and twins with the (100) plane as a twinning plane (a plane of symmetry) are likely to be formed during crystal growth.

The β-Ga$_2$O$_3$-based single crystal substrate 1 with a few twins shown in FIG. 1B preferably has a diameter of not less than 2 inches and more preferably has a region 2 in which a width Ws is not less than 2 inches and twinning planes 3 are not present. The width Ws of the region 2 here is the maximum width in a direction perpendicular to a line of intersection of the twinning plane 3 and the main surface of the β-Ga$_2$O$_3$-based single crystal substrate 1. The width Ws of the region 2 is preferably larger since the region having the twinning planes 3 is not preferable as a base for epitaxial crystal growth.

Figure 2A:
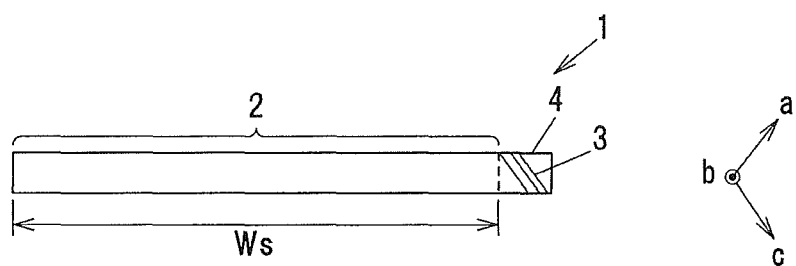
FIGS. 2A and 2B are cross sectional views showing β-Ga₂O₃-based single crystal substrates with a few twinned crystals in the first embodiment.
Figure 2B:
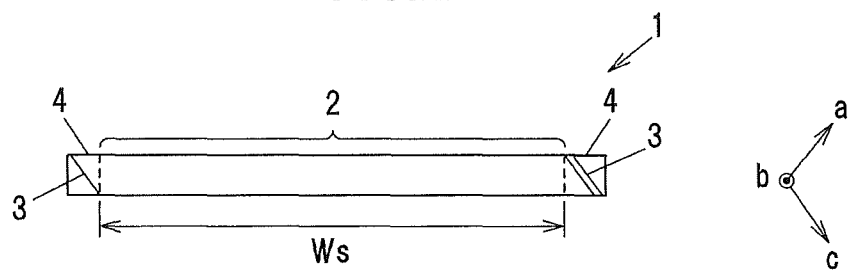

FIGS. 2A and 2B are cross sectional views showing the β-Ga$_2$O$_3$-based single crystal substrates 1 with a few twins. FIGS. 2A and 2B each show a cross section which passes through the center of the β-Ga$_2$O$_3$-based single crystal substrate 1 and is perpendicular to the twinning plane 3. Axes shown on the right side of the drawings indicate directions of a-, b- and c-axes of a β-Ga$_2$O$_3$ single crystal which is a base material of the β-Ga$_2$O$_3$-based single crystal substrate 1.

FIG. 2A shows an example of the region 2 when the twinning planes 3 are present on one side of the β-Ga$_2$O$_3$-based single crystal substrate 1 and FIG. 2B shows another example of the region 2 when the twinning planes 3 are present on both sides of the β-Ga$_2$O$_3$-based single crystal substrate 1. In FIGS. 2A and 2B, cross sections of the β-Ga$_2$O$_3$-based single crystal substrates 1 having a (−201) plane as the main surface are shown as an example.

Figure 3A:
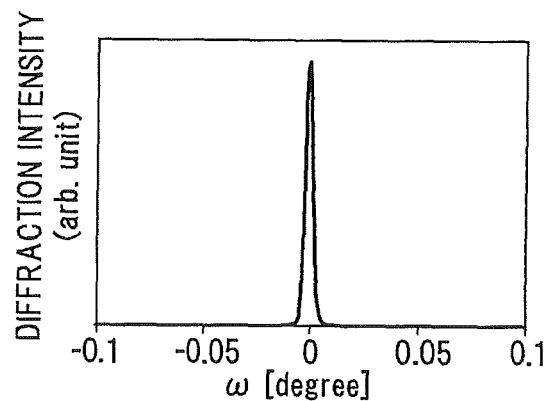
FIGS. 3A and 3B are diagrams illustrating x-ray diffraction spectra obtained by x-ray rocking curve measurement on β-Ga₂O₃-based single crystal substrates with a (−201)-oriented main surface in the first embodiment.
Figure 3B:
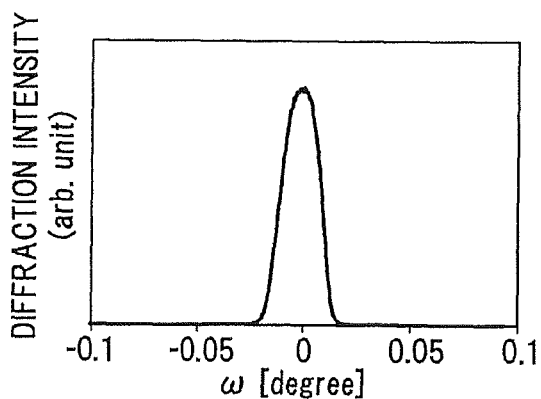
Figure 3C:
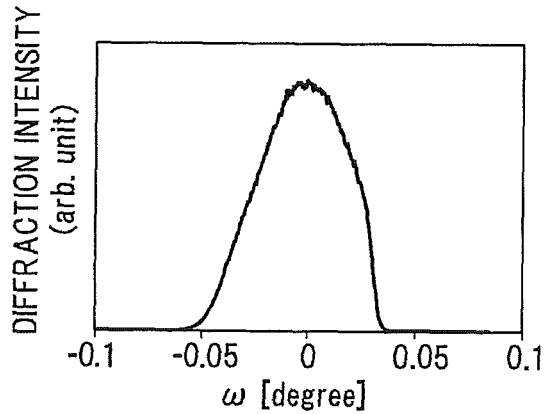
FIG. 3C is a diagram illustrating an x-ray diffraction spectrum obtained by x-ray rocking curve measurement on a conventional β-Ga₂O₃ single crystal substrate with a (−201)-oriented main surface.

Crystal Orientation and Dislocation Density of β-Ga$_2$O$_3$-Based Single Crystal Substrate FIGS. 3A and 3B are diagrams illustrating x-ray diffraction spectra obtained by x-ray rocking curve measurement on two β-Ga$_2$O$_3$-based single crystal substrates 1 with a (−201)-oriented main surface 4. FIG. 3C is a diagram illustrating an x-ray diffraction spectrum obtained by x-ray rocking curve measurement on a conventional β-Ga$_2$O$_3$ single crystal substrate with a (−201)-oriented main surface. The conventional β-Ga$_2$O$_3$ single crystal substrate is a substrate cut from a β-Ga$_2$O$_3$ single crystal grown by a conventional EFG crystal manufacturing apparatus which does not have below-described after-heater 20 and reflective plate 21.

X-ray diffraction spectra measured on the center point of the main surface 4 of each β-Ga$_2$O$_3$-based single crystal substrate 1 and the center point of the main surface of the conventional β-Ga$_2$O$_3$ single crystal substrate are shown in FIGS. 3A to 3C.

In FIGS. 3A to 3C, a horizontal axis indicates an incident angle ω (degrees) of an x-ray on the β-Ga$_2$O$_3$-based single crystal substrate 1 or the conventional β-Ga$_2$O$_3$ single crystal substrate and a vertical axis indicates diffraction intensity (arbitrary unit) of the x-ray.

The diffraction peaks shown in FIGS. 3A to 3C are due to diffraction from a (−201) plane of a β-Ga$_2$O$_3$-based single crystal constituting the β-Ga$_2$O$_3$-based single crystal substrate 1 or the conventional β-Ga$_2$O$_3$ single crystal substrate, and the full width at half maximum (FWHM) thereof are respectively 14 seconds (arcseconds), 74 seconds and 200 seconds. The small FWHM of the β-Ga$_2$O$_3$-based single crystal substrate 1 means that the 3-Ga$_2$O$_3$-based single crystal substrate 1 has excellent orientation in a direction perpendicular to the (−201) plane.

When the main surface 4 of the β-Ga$_2$O$_3$-based single crystal substrate 1 is oriented to, e.g., (−201), having excellent orientation in a direction perpendicular to the (−201) plane indicates that orientation of the main surface of the β-Ga$_2$O$_3$-based single crystal is excellent.

As a result of experiments, it was found that the FWHM of diffraction peak from the (−201) plane of the β-Ga$_2$O$_3$-based single crystal substrate 1 having the (−201)-oriented mains surface falls within a range of about not less than 14 seconds and not more than 100 seconds. The FWHM in this range varies depending mainly on crystal quality of a seed crystal (a below-described seed crystal 31) used for growing a β-Ga$_2$O$_3$-based single crystal (a below-described β-Ga$_2$O$_3$-based single crystal 32) which is to be cut into the β-Ga$_2$O$_3$-based single crystal substrate 1.

The crystal quality of the seed crystal 31 here is determined by plotting x-ray rocking curve peak positions on a graph in which the horizontal axis indicates measurement position on the seed crystal 31 and the vertical axis indicates a rotation angle ω of the seed crystal 31. The crystal quality is judged higher as the curved line formed of a set of plot points is closer to a straight line. In the x-ray rocking curve measurement, diffraction e.g. through a (010) plane at a (111) plane of the seed crystal 31 is measured.

It was also found that, especially when the seed crystal 31 with high crystal quality is used, the FWHM of diffraction peak from the (−201) plane of the β-Ga$_2$O$_3$-based single crystal substrate 1 having the (−201)-oriented mains surface falls within a range of about not less than 14 seconds and not more than 35 seconds.

Also in the x-ray rocking curve measurement on the β-Ga$_2$O$_3$-based single crystal substrate 1 of which main surface 4 is not oriented to (−201), e.g., is inclined at a predetermined angle (offset angle, e.g., at)+1° from the (−201) plane, the FWHM range of diffraction peak from the (−201) plane is substantially the same as that in the case where the main surface 4 is oriented to (−201).

When, for example, a substrate without off-angle and a substrate with off-angle are cut from one single crystal ingot, only difference is an angle formed between a wire saw and a main surface of the single crystal ingot at the time of slicing and quality of the crystal constituting the substrate is the same, hence, the same FWHMs of diffraction peaks from the same crystal planes.

Figure 4A:
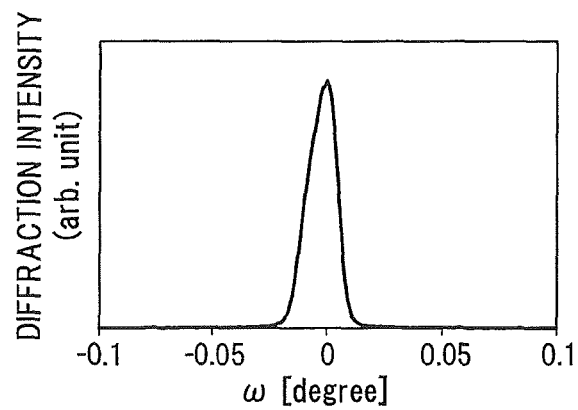
FIGS. 4A and 4B are diagrams illustrating x-ray diffraction spectra obtained by x-ray rocking curve measurement on β-Ga₂O₃-based single crystal substrates 1 with a (001)-oriented main surface 4 in the first embodiment.
Figure 4B:
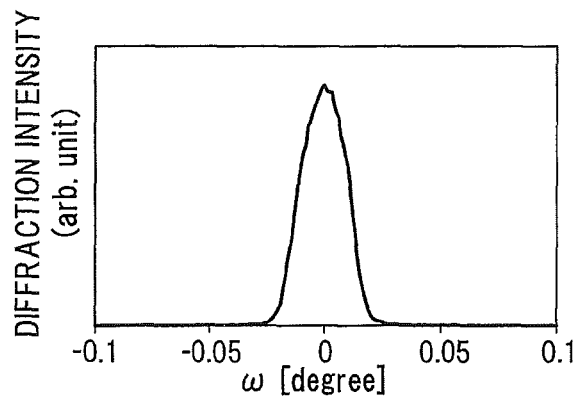

FIGS. 4A and 4B are diagrams illustrating x-ray diffraction spectra obtained by x-ray rocking curve measurement on two β-Ga$_2$O$_3$-based single crystal substrates 1 with a (001)-oriented main surface 4.

X-ray diffraction spectra measured on the center point of the main surface 4 of each β-Ga$_2$O$_3$-based single crystal substrate 1 are shown in FIGS. 4A and 4B.

In FIGS. 4A and 4B, a horizontal axis indicates an incident angle ω (degrees) of an x-ray on the β-Ga$_2$O$_3$-based single crystal substrate 1 and a vertical axis indicates diffraction intensity (arbitrary unit) of the x-ray.

The diffraction peaks shown in FIGS. 4A and 4B are due to diffraction from a (001) plane of a β-Ga$_2$O$_3$-based single crystal constituting the β-Ga$_2$O$_3$-based single crystal substrate 1, and the FWHM thereof are respectively 36 seconds and 87 seconds. The small FWHM of the β-Ga$_2$O$_3$-based single crystal substrate 1 means that the β-Ga$_2$O$_3$-based single crystal substrate 1 has excellent orientation in a direction perpendicular to the (001) plane.

When the main surface 4 of the β-Ga$_2$O$_3$-based single crystal substrate 1 is oriented to, e.g., (001), having excellent orientation in a direction perpendicular to the (001) plane indicates that orientation of the main surface of the β-Ga$_2$O$_3$-based single crystal is excellent.

In the β-Ga$_2$O$_3$-based single crystal, both the (−201) plane and the (001) plane are parallel to a <010> axis direction and have similar crystal orientation. It is therefore considered that the FWHM range of diffraction peak from the (001) plane is substantially the same as that from the (−201) plane.

Also in the x-ray rocking curve measurement on the β-Ga$_2$O$_3$-based single crystal substrate 1 of which orientation of the main surface 4 is not oriented to (001), e.g., is inclined at a predetermined angle (offset angle, e.g., at)±1° from the (001) plane, the FWHM range of diffraction peak from the (001) plane is substantially the same as that in the case where the main surface 4 is oriented to the (001) plane.

Disorder in the crystal structure of the β-Ga$_2$O$_3$-based single crystal constituting the β-Ga$_2$O$_3$-based single crystal substrate 1 is not just a disorder of orientation in a specific direction. Therefore, the FWHM range of diffraction peak from any crystal planes of the β-Ga$_2$O$_3$-based single crystal, e.g., from the (101) plane, is substantially the same as that from the (−201) plane.

Meanwhile, average dislocation densities in the two β-Ga$_2$O$_3$-based single crystal substrates 1 with the (−201)-oriented main surface 4 are respectively $3.9 \times 10^4$ cm$^2$ and $7.8 \times 10^4$ cm$^2$, by which it is confirmed that only a few dislocations are contained.

On the other hand, an average dislocation density in the conventional β-Ga$_2$O$_3$ single crystal substrate with the (−201)-oriented main surface is $1.1 \times 10^5$ cm$^{-2}$. The conventional β-Ga$_2$O$_3$ single crystal substrate is a substrate cut from a β-Ga$_2$O$_3$ single crystal grown by a conventional EFG crystal manufacturing apparatus which does not have the below-described after-heater 20 and reflective plate 21.

These average dislocation densities are each derived from an average of etch pit density on the main surface 4 of the β-Ga$_2$O$_3$-based single crystal substrate 1 or on the main surface of the conventional β-Ga$_2$O$_3$ single crystal substrate. It has been confirmed that the dislocation density and the etch pit density on the main surface 4 of the β-Ga$_2$O$_3$-based single crystal substrate 1 are substantially the same.

When the mirror-polished β-Ga$_2$O$_3$-based single crystal substrate 1 is chemically etched with hot phosphoric acid, etc., the etching rate is increased at a portion with defects and this causes depressions (etch pits) to be formed. In the defect assessment of the etch-pit portion, it was observed that dislocations correspond one-to-one with the etch-pit portions. This revealed that it is possible to estimate a dislocation density from an etch pit density. The number of etch pits per unit area is counted at five points (the center point and four points therearound) on the substrate under an optical microscope and the average etch pit density is derived by averaging the counted numbers.

Also when orientation of the main surface 4 of the β-Ga$_2$O$_3$-based single crystal substrate 1 is other than (−201), e.g., is (101) or (001), the average dislocation density is substantially the same as that in the case where the main surface 4 is oriented to (−201).

The FWHM of x-ray rocking curve and average dislocation density of the β-Ga$_2$O$_3$-based single crystal substrate 1 can be reduced to smaller than 75 seconds and $9 \times 10^4$ cm$^{-2}$ which are those of a β-Ga$_2$O$_3$-based single crystal grown by the conventional EFG method as is disclosed in the previously mentioned Non-Patent Literature. This result shows that the β-Ga$_2$O$_3$-based single crystal substrate 1, which is cut from a β-Ga$_2$O$_3$-based single crystal grown by the below-described new method, has better crystal orientation and less dislocations than a β-Ga$_2$O$_3$-based single crystal substrate cut from a β-Ga$_2$O$_3$-based single crystal grown by the conventional EFG method.

Method of Manufacturing β-Ga$_2$O$_3$-Based Single Crystal Substrate

Figure 5:
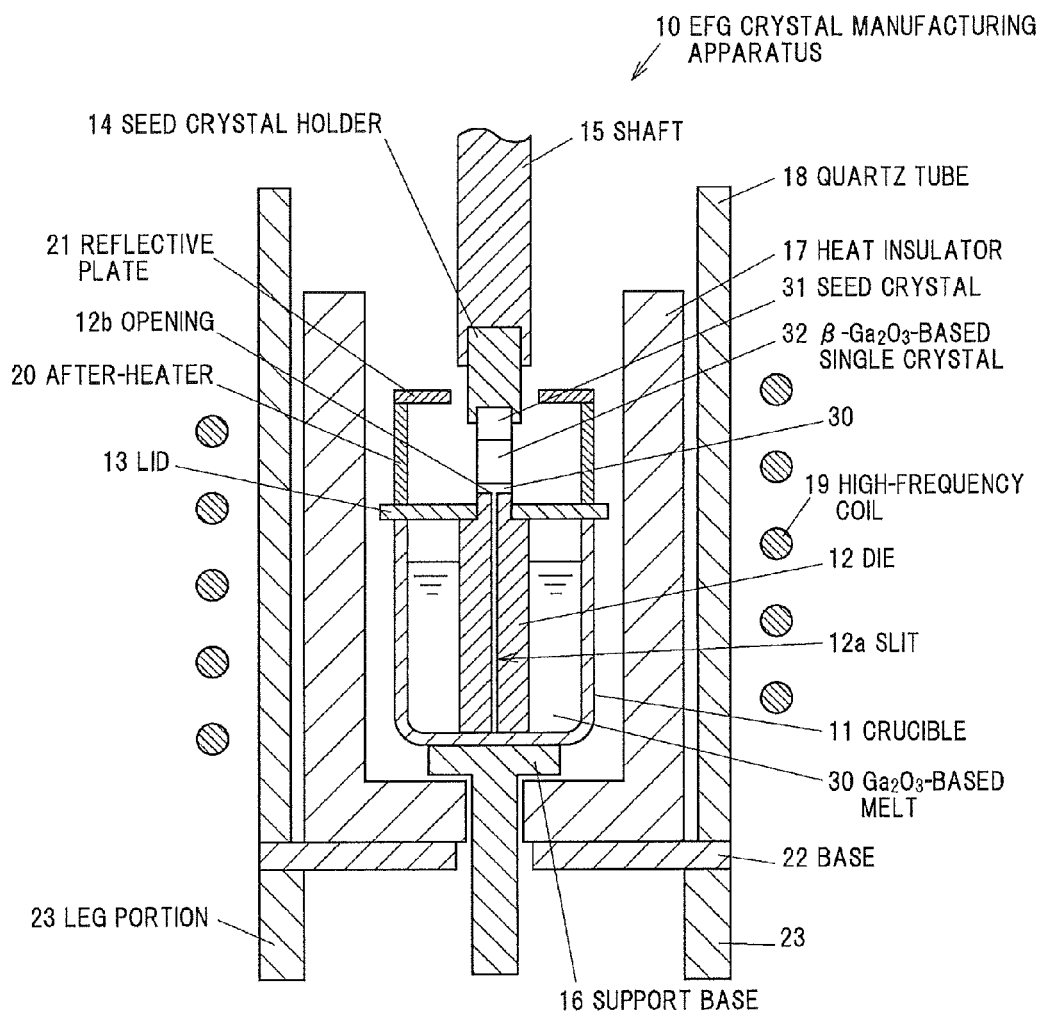
FIG. 5 is a vertical cross-sectional view showing an EFG crystal manufacturing apparatus in the first embodiment.

FIG. 5 is a vertical cross-sectional view showing an EFG (Edge Defined Film Fed Growth) crystal manufacturing apparatus 10 in the first embodiment.

The EFG crystal manufacturing apparatus 10 has a crucible 11 which is placed in a quartz tube 18 and contains Ga$_2$O$_3$-based melt 30, a die 12 placed in the crucible 11 and having a slit 12a, a lid 13 covering an opening of the crucible 11 so that the top surface of the die 12 including an opening 12b is exposed, a seed crystal holder 14 for holding the seed crystal 31, a shaft 15 vertically movably supporting the seed crystal holder 14, a support base 16 for placing the crucible 11, a heat insulator 17 provided along an inner wall of the quartz tube 18, a high-frequency coil 19 for high-frequency induction heating provided around the quartz tube 18, a base 22 for supporting the quartz tube 18 and the heat insulator 17, and leg portions 23 attached to the base 22.

The EFG crystal manufacturing apparatus 10 further includes an after-heater 20 and a reflective plate 21. The after-heater 20 is formed of Ir, etc., and is provided to surround a region above the crucible 11 where a β-Ga$_2$O$_3$-based single crystal 32 is grown. The reflective plate 21 is formed of Ir, etc., and is provided, like a lid, on the after-heater 20.

The crucible 11 contains the Ga$_2$O$_3$-based melt 30 which is obtained by melting a Ga$_2$O$_3$-based raw material. The crucible 11 is formed of a highly heat-resistant material such as Ir capable of containing the Ga$_2$O$_3$-based melt 30.

The die 12 has the slit 12a to draw up the Ga$_2$O$_3$-based melt 30 in the crucible 11 by capillary action. The die 12 is formed of a highly heat-resistant material such as Ir in the same manner as the crucible 11.

The lid 13 prevents the high-temperature Ga$_2$O$_3$-based melt 30 from evaporating from the crucible 11 and further prevents the evaporated substances from attaching to members located outside of the crucible 11.

The high-frequency coil 19 is helically arranged around the quartz tube 18 and inductively heats the crucible 11 and the after-heater 20 by a high-frequency current which is supplied from a non-illustrated power source. This causes the Ga$_2$O$_3$-based raw material in the crucible to melt and the Ga$_2$O$_3$-based melt 30 is thereby obtained.

The heat insulator 17 is provided around the crucible 11 with a predetermined gap. The heat insulator 17 retains heat and is thus capable of suppressing a rapid temperature change of the inductively-heated crucible 11, etc.

The after-heater 20 generates heat by induction heating and the reflective plate 21 downwardly reflects heat radiated from the after-heater 20 and the crucible 11. The present inventors confirmed that the after-heater 20 is capable of reducing radial (horizontal) temperature gradient in a hot zone and the reflective plate 21 is capable of reducing temperature gradient in a crystal growth direction in the hot zone.

It is possible to reduce the FWHM of x-ray rocking curve and average dislocation density of the $\beta$-$Ga_2O_3$-based single crystal 32 by providing the after-heater 20 and the reflective plate 21 on the EFG crystal manufacturing apparatus 10. This allows the $\beta$-$Ga_2O_3$-based single crystal substrate 1 with small FWHM of x-ray rocking curve and less average dislocation density to be obtained from the $\beta$-$Ga_2O_3$-based single crystal 32.

Figure 6:
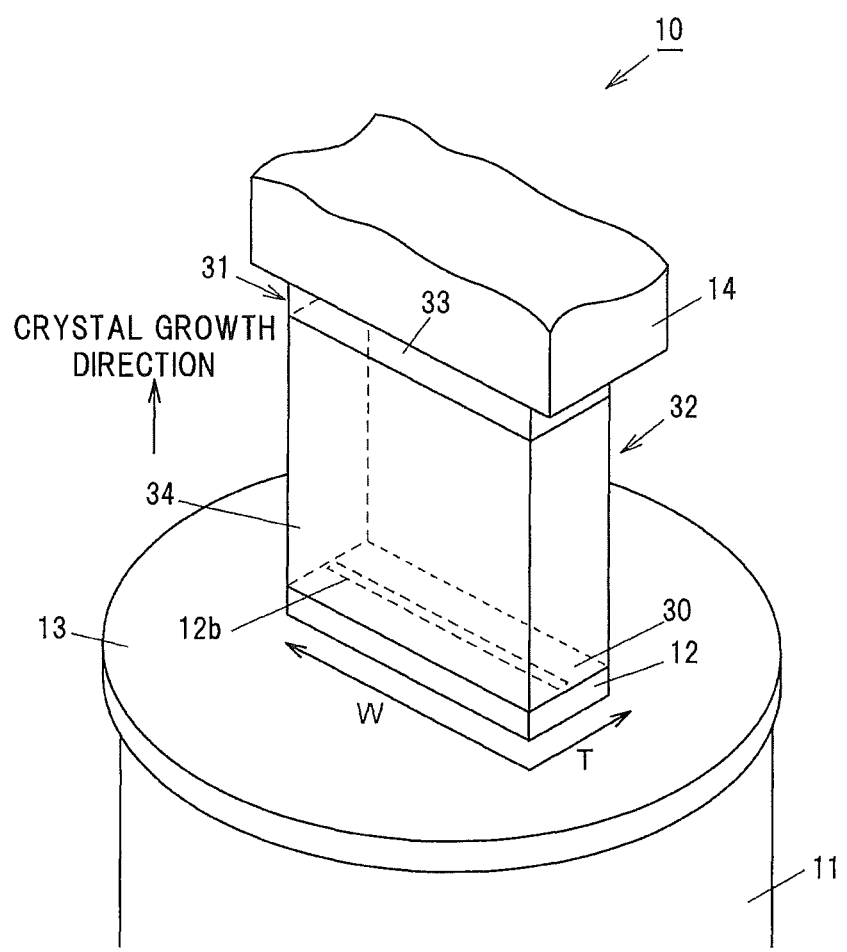
FIG. 6 is a perspective view showing a state during growth of a β-Ga₂O₃-based single crystal in the first embodiment.

FIG. 6 is a perspective view showing a state during growth of the $\beta$-$Ga_2O_3$-based single crystal 32 in the first embodiment. Illustrations of members around the $\beta$-$Ga_2O_3$-based single crystal 32 are omitted in FIG. 6.

To grow the $\beta$-$Ga_2O_3$-based single crystal 32, firstly, the $Ga_2O_3$-based melt 30 in the crucible 11 is drawn up to the opening 12b of the die 12 through the slit 12a of the die 12, and the seed crystal 31 is then brought into contact with the $Ga_2O_3$-based melt 30 present in the opening 12b of the die 12. Next, the seed crystal 31 in contact with the $Ga_2O_3$-based melt 30 is pulled vertically upward, thereby growing the $\beta$-$Ga_2O_3$-based single crystal 32.

The seed crystal 31 is a $\beta$-$Ga_2O_3$-based single crystal which does not have or hardly has twinning planes. The seed crystal 31 has substantially the same width and thickness as the $\beta$-$Ga_2O_3$-based single crystal 32 to be grown. Thus, it is possible to grow the $\beta$-$Ga_2O_3$-based single crystal 32 without broadening a shoulder thereof in a width direction W and a thickness direction T.

Since the growth of the $\beta$-$Ga_2O_3$-based single crystal 32 does not involve a process of broadening a shoulder in the width direction W, twinning of the $\beta$-$Ga_2O_3$-based single crystal 32 is suppressed. Meanwhile, unlike the broadening of shoulder in the width direction W, twins are less likely to be formed when broadening the shoulder in the thickness direction T, and thus the growth of the $\beta$-$Ga_2O_3$-based single crystal 32 may involve a process of broadening a shoulder in the thickness direction T. However, in the case that the process of broadening a shoulder in the thickness direction T is not performed, substantially the entire $\beta$-$Ga_2O_3$-based single crystal 32 becomes a plate-shaped region which can be cut into substrates and this allows the substrate manufacturing cost to be reduced. Therefore, it is preferable to not perform the process of broadening a shoulder in the thickness direction T but to use a thick seed crystal 31 to ensure sufficient thickness of the $\beta$-$Ga_2O_3$-based single crystal 32 as shown in FIG. 6.

In addition, when growing a $\beta$-$Ga_2O_3$-based single crystal while broadening a shoulder thereof, deterioration of crystal orientation or an increase in dislocations may occur depending on an angle of broadening the shoulder. In contrast, since growth of the $\beta$-$Ga_2O_3$-based single crystal 32 does not involve at least the process of broadening a shoulder in the width direction W, it is possible to suppress deterioration of crystal orientation or an increase in dislocations which are caused by the shoulder broadening.

The orientation of a horizontally-facing surface 33 of the seed crystal 31 coincides with that of a main surface 34 of the $\beta$-$Ga_2O_3$-based single crystal 32. Therefore, for obtaining the $\beta$-$Ga_2O_3$-based single crystal substrate 1 having, e.g., the (−201)-oriented main surface 4 from the $\beta$-$Ga_2O_3$-based single crystal 32, the $\beta$-$Ga_2O_3$-based single crystal 32 is grown in a state that the surface 33 of the seed crystal 31 is oriented to (−201).

Next, a method in which a wide seed crystal 31 with a width equivalent to the $\beta$-$Ga_2O_3$-based single crystal 32 is formed using a quadrangular prism-shaped narrow-width seed crystal will be described.

Figure 7:
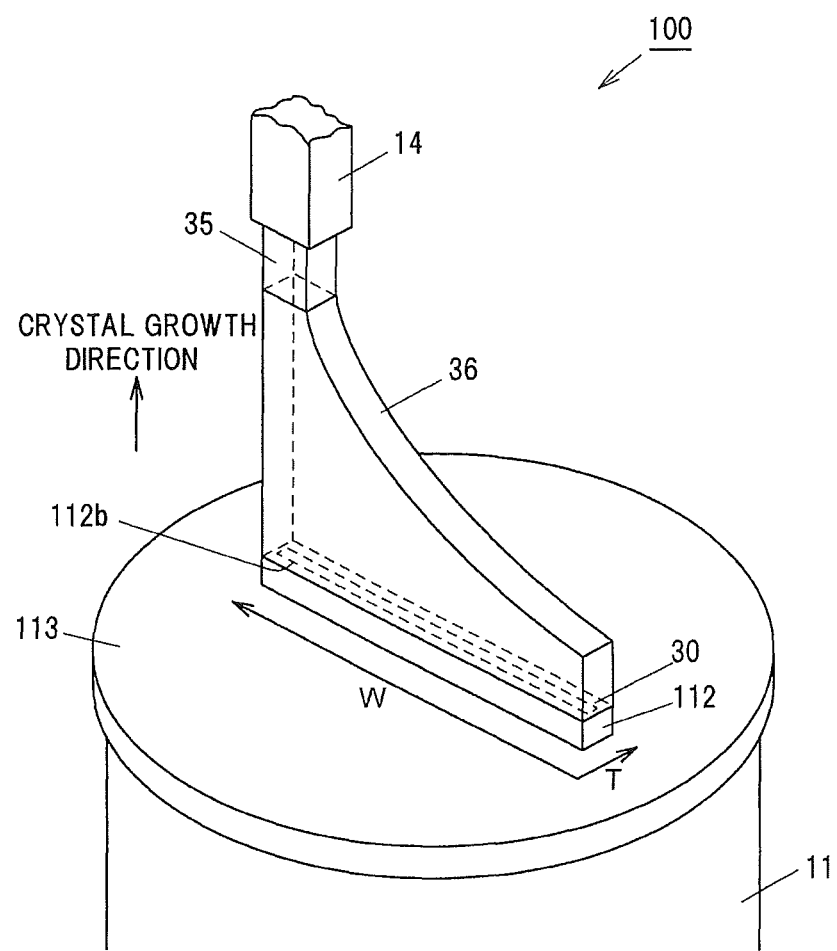
FIG. 7 is a perspective view showing a state of growing a β-Ga₂O₃-based single crystal from which a seed crystal is cut off.

FIG. 7 is a perspective view showing a state of growing a $\beta$-$Ga_2O_3$-based single crystal 36 to be cut into the seed crystal 31.

The seed crystal 31 is cut from a region of the $\beta$-$Ga_2O_3$-based single crystal 36 not having or hardly having twinning planes. Therefore, a width (a size in the width direction W) of the 3-$Ga_2O_3$-based single crystal 36 is larger than the width of the seed crystal 31.

Meanwhile, a thickness (a size in the thickness direction T) of the $\beta$-$Ga_2O_3$-based single crystal 36 may be smaller than the thickness of the seed crystal 31. In such a case, the seed crystal 31 is not cut directly from the $\beta$-$Ga_2O_3$-based single crystal 36. Instead, a $\beta$-$Ga_2O_3$-based single crystal is firstly grown from a seed crystal cut from the $\beta$-$Ga_2O_3$-based single crystal 36 while broadening a shoulder in the thickness direction T and is then cut into the seed crystal 31.

For growing the $\beta$-$Ga_2O_3$-based single crystal 36, it is possible to use an EFG crystal manufacturing apparatus 100 which has substantially the same structure as the EFG crystal manufacturing apparatus 10 used for growing the $\beta$-$Ga_2O_3$-based single crystal 32. However, width, or width and thickness, of a die 112 of the EFG crystal manufacturing apparatus 100 is/are different from that/those of the die 12 of the EFG crystal manufacturing apparatus 10 since the width, or width and thickness, of the $\beta$-$Ga_2O_3$-based single crystal 36 is/are different from that/those of the $\beta$-$Ga_2O_3$-based single crystal 32. The size of an opening 112b of the die 112 may be the same as the opening 12b of the die 12.

A seed crystal 35 is a quadrangular prism-shaped $\beta$-$Ga_2O_3$-based single crystal with a smaller width than the $\beta$-$Ga_2O_3$-based single crystal 36 to be grown.

To grow the $\beta$-$Ga_2O_3$-based single crystal 36, firstly, the $Ga_2O_3$-based melt 30 in the crucible 11 is drawn up to the opening 112b of the die 112 through a slit of the die 112, and the seed crystal 35 is then brought into contact with the $Ga_2O_3$-based melt 30 present in the opening 112b of the die 112 in a state that a horizontal position of the seed crystal 35 is offset in the width direction W from the center of the die 112 in the width direction W. In this regard, more preferably, the seed crystal 35 is brought into contact with the $Ga_2O_3$-based melt 30 covering the top surface of the die 112 in a state that the horizontal position of the seed crystal 35 is located at an edge of the die 112 in the width direction W.

Next, the seed crystal 35 in contact with the $Ga_2O_3$-based melt 30 is pulled vertically upward, thereby growing the $\beta$-$Ga_2O_3$-based single crystal 36.

The $\beta$-$Ga_2O_3$-based single crystal has high cleavability on the (100) plane as described above, and twins with the (100) plane as a twinning plane (a plane of symmetry) are likely to be formed in the shoulder broadening process during crystal growth. Therefore, it is preferable to grow the $\beta$-$Ga_2O_3$-based single crystal 32 in a direction in which the (100) plane is parallel to the growth direction of the $\beta$-$Ga_2O_3$-based single crystal 32, e.g., to grow in a b-axis direction or a c-axis direction so as to allow the size of a crystal without twins cut from the $\beta$-$Ga_2O_3$-based single crystal 32 to be maximized.

It is especially preferable to grow the $\beta$-$Ga_2O_3$-based single crystal 32 in the b-axis direction since the $\beta$-$Ga_2O_3$-based single crystal is liable to grow in the b-axis direction.

In the meantime, in case that the growing $\beta$-$Ga_2O_3$-based single crystal is twinned during the process of broadening a shoulder in a width direction, twinning planes are likely to be formed in a region close to the seed crystal and are less likely to be formed at positions distant from the seed crystal.

The method of growing the β-$Ga_2O_3$-based single crystal 36 in the first embodiment uses such twinning properties of the β-$Ga_2O_3$-based single crystal. In the first embodiment, since the β-$Ga_2O_3$-based single crystal 36 is grown in the state that the horizontal position of the seed crystal 35 is offset in the width direction W from the center of the die 112 in the width direction W, a region (horizontally broadening as shown in FIG. 7) at a large distance from the seed crystal 35 is produced in the β-$Ga_2O_3$-based single crystal 36, as compared to the case of growing the β-$Ga_2O_3$-based single crystal 36 in a state that the horizontal position of the seed crystal 35 is located on the center of the die 112 in the width direction W. Twinning planes are less likely to be formed in such a region and it is thus possible to cut out a wide seed crystal 31.

For growing the β-$Ga_2O_3$-based single crystal 36 using the seed crystal 35 and for cutting the β-$Ga_2O_3$-based single crystal 36 into a seed crystal, it is possible to use a technique disclosed in Japanese patent application No. 2013-102599.

Next, an example method of cutting the grown β-$Ga_2O_3$-based single crystal 32 into the β-$Ga_2O_3$-based single crystal substrate 1 will be described.

Firstly, the β-$Ga_2O_3$-based single crystal 32 having a thickness of, e.g., 18 mm is grown and is then annealed to relieve thermal stress during single crystal growth and to improve electrical characteristics. The annealing is performed, e.g., in an inactive atmosphere such as nitrogen while maintaining temperature at 1400 to 1600° C. for 6 to 10 hours.

Next, the seed crystal 31 and the β-$Ga_2O_3$-based single crystal 32 are separated by cutting with a diamond blade. Firstly, the β-$Ga_2O_3$-based single crystal 32 is fixed to a carbon stage with heat-melting wax in-between. The β-$Ga_2O_3$-based single crystal 32 fixed to the carbon stage is set on a cutting machine and is cut for separation. The grit number of the blade is preferably about #200 to #600 (defined by JIS B 4131) and a cutting rate is preferably about 6 to 10 mm per minute. After cutting, the β-$Ga_2O_3$-based single crystal 32 is detached from the carbon stage by heating.

Next, the edge of the β-$Ga_2O_3$-based single crystal 32 is shaped into a circular shape by an ultrasonic machining device or a wire-electrical discharge machine. Orientation flats may be formed at the edge of the circularly-shaped β-$Ga_2O_3$-based single crystal 32.

Next, the circularly-shaped β-$Ga_2O_3$-based single crystal 32 is sliced to about 1 mm thick by a multi-wire saw, thereby obtaining the β-$Ga_2O_3$-based single crystal substrate 1. In this process, it is possible to slice at a desired offset angle. It is preferable to use a fixed-abrasive wire saw. A slicing rate is preferably about 0.125 to 0.3 mm per minute.

Next, the β-$Ga_2O_3$-based single crystal substrate 1 is annealed to reduce processing strain and to improve electrical characteristics as well as permeability. The annealing is performed in an oxygen atmosphere during temperature rise and is performed in an inactive atmosphere such as nitrogen atmosphere when maintaining temperature after the temperature rise. The temperature to be maintained here is preferably 1400 to 1600° C.

Next, the edge of the β-$Ga_2O_3$-based single crystal substrate 1 is chamfered (bevel process) at a desired angle.

Next, the β-$Ga_2O_3$-based single crystal substrate 1 is ground to a desired thickness by a diamond abrasive grinding wheel. The grit number of the grinding wheel is preferably about #800 to #1000 (defined by JIS B 4131).

Next, the β-$Ga_2O_3$-based single crystal substrate is polished to a desired thickness using a turntable and diamond slurry. It is preferable to use a turntable formed of a metal-based or glass-based material. A grain size of the diamond slurry is preferably about 0.5 μm.

Next, the β-$Ga_2O_3$-based single crystal substrate 1 is polished using a polishing cloth and CMP (Chemical Mechanical Polishing) slurry until atomic-scale flatness is obtained. The polishing cloth formed of nylon, silk fiber or urethane, etc., is preferable. Slurry of colloidal silica is preferably used. The main surface of the β-$Ga_2O_3$-based single crystal substrate 1 after the CMP process has a mean roughness of about Ra=0.05 to 0.1 nm.

Second Embodiment

The second embodiment is an embodiment of a semiconductor multilayer structure including the β-$Ga_2O_3$-based single crystal substrate 1 in the first embodiment.

Configuration of Semiconductor Multilayer Structure

Figure 8:
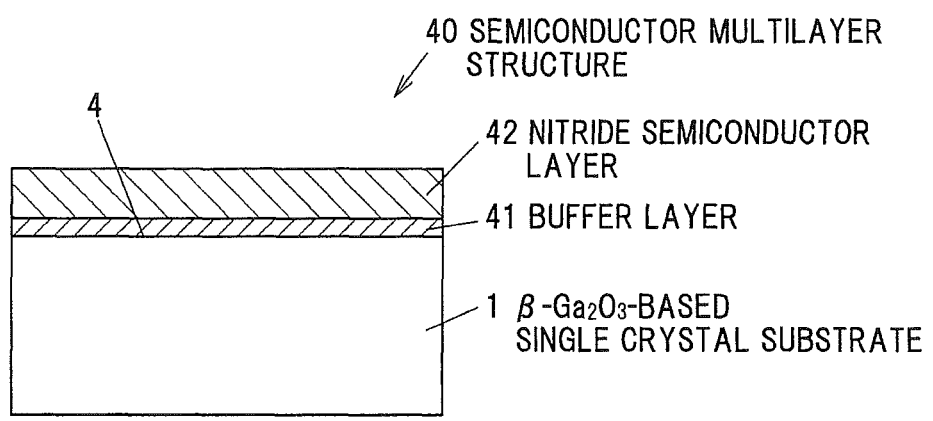
FIG. 8 is a vertical cross-sectional view showing a semiconductor multilayer structure in a second embodiment.

FIG. 8 is a vertical cross-sectional view showing a semiconductor multilayer structure 40 in the second embodiment. The semiconductor multilayer structure 40 has the β-$Ga_2O_3$-based single crystal substrate 1 and a nitride semiconductor layer 42 which is formed on the main surface 4 of the β-$Ga_2O_3$-based single crystal substrate 1 by epitaxial crystal growth. It is preferable to also provide a buffer layer 41 between the β-$Ga_2O_3$-based single crystal substrate 1 and the nitride semiconductor layer 42 as shown in FIG. 8 to reduce lattice mismatch between the β-$Ga_2O_3$-based single crystal substrate 1 and the nitride semiconductor layer 42.

The β-$Ga_2O_3$-based single crystal substrate 1 may contain a conductive impurity such as Si. The thickness of the β-$Ga_2O_3$-based single crystal substrate 1 is, e.g., 400 μm. The β-$Ga_2O_3$-based single crystal substrate 1 has excellent crystal orientation and less dislocations, as described in the first embodiment. Thus, the nitride semiconductor layer 42 formed on the β-$Ga_2O_3$-based single crystal substrate 1 by epitaxial growth also has excellent crystal orientation and less dislocations.

The buffer layer 41 is formed of an $Al_xGa_yIn_zN$ (0≤x≤1, 0≤y≤1, 0≤z≤1, x+y+z=1) crystal. On the β-$Ga_2O_3$-based single crystal substrate 1, the buffer layer 41 may be formed in an island pattern or in the form of film. The buffer layer 41 may contain a conductive impurity such as Si.

In addition, among $Al_xGa_yIn_zN$ crystals, an AlN crystal (x=1, y=z=0) is particularly preferable to form the buffer layer 41. When the buffer layer 41 is formed of the AlN crystal, adhesion between the β-$Ga_2O_3$-based single crystal substrate 1 and the nitride semiconductor layer 42 is further increased. The thickness of the buffer layer 41 is, e.g., 1 to 5 nm.

The buffer layer 41 is formed on the main surface 4 of the β-$Ga_2O_3$-based single crystal substrate 1 by, e.g., epitaxially growing an $Al_xGa_yIn_zN$ (0≤x≤1, 0≤y≤1, 0≤z≤1, x+y+z=1) crystal at a growth temperature of about 370 to 500° C.

The nitride semiconductor layer 42 is formed of an $Al_xGa_yIn_zN$ (0≤x≤1, 0≤y≤1, 0≤z≤1, x+y+z=1) crystal and is particularly preferably formed of a GaN crystal (y=1, x=z=0) from which a high-quality crystal is easily obtained. The thickness of the nitride semiconductor layer 42 is, e.g., 5 μm. The nitride semiconductor layer 42 may contain a conductive impurity such as Si.

The nitride semiconductor layer 42 is formed on the main surface 4 of the β-$Ga_2O_3$-based single crystal substrate 1 via the buffer layer 41 by, e.g., epitaxially growing an $Al_xGa_yIn_zN$ (0≤x≤1, 0≤y≤1, 0≤z≤1, x+y+z=1) crystal at a growth temperature of about 1000° C.

Third Embodiment

The third embodiment is an embodiment of a semiconductor element including the semiconductor multilayer structure 40 in the second embodiment. An LED element will be described below as an example of such a semiconductor element.

Configuration of Semiconductor Element

Figure 9:
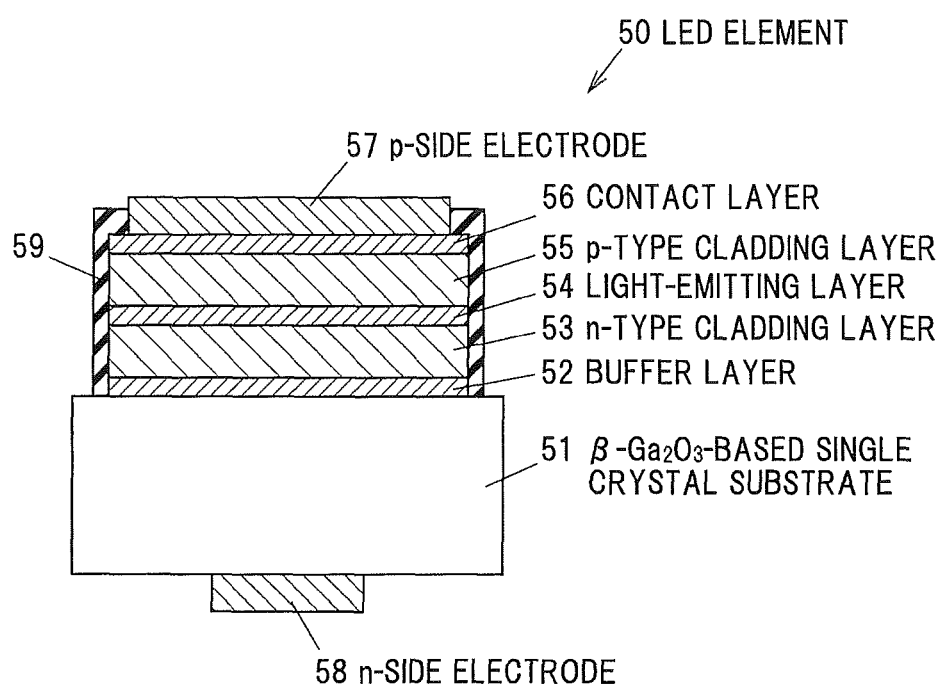
FIG. 9 is a vertical cross-sectional view showing an LED element in a third embodiment.

FIG. 9 is a vertical cross-sectional view showing an LED element 50 in the third embodiment. The LED element 50 has a β-$Ga_2O_3$-based single crystal substrate 51, a buffer layer 52 on the β-$Ga_2O_3$-based single crystal substrate 51, an n-type cladding layer 53 on the buffer layer 52, a light-emitting layer 54 on the n-type cladding layer 53, a p-type cladding layer 55 on the light-emitting layer 54, a contact layer 56 on the p-type cladding layer 55, a p-side electrode 57 on the contact layer 56 and an n-side electrode 58 on a surface of the β-$Ga_2O_3$-based single crystal substrate 51 opposite to the buffer layer 52.

Then, side surfaces of the laminate composed of the buffer layer 52, the n-type cladding layer 53, the light-emitting layer 54, the p-type cladding layer 55 and the contact layer 56 are covered with an insulating film 59.

Here, the β-$Ga_2O_3$-based single crystal substrate 51, the buffer layer 52 and the n-type cladding layer 53 are formed by respectively dividing or patterning the β-$Ga_2O_3$-based single crystal substrate 1, the buffer layer 41 and the nitride semiconductor layer 42 which constitute the semiconductor multilayer structure 40 in the first embodiment. The thicknesses of the β-$Ga_2O_3$-based single crystal substrate 51, the buffer layer 52 and the n-type cladding layer 53 are respectively, e.g., 400 μm, 5 nm and 5 μm.

Addition of a conductive impurity allows the β-$Ga_2O_3$-based single crystal substrate 51 to have conductivity and it is thereby possible to use the β-$Ga_2O_3$-based single crystal substrate 51 to form a vertical-type semiconductor device as is the LED element 50 in which electricity is conducted in a thickness direction. In addition, the β-$Ga_2O_3$-based single crystal substrate 51 is transparent to light in a wide range of wavelength. Therefore, in a light-emitting device as is the LED element 50, it is possible to extract light on the β-$Ga_2O_3$-based single crystal substrate 51 side.

The n-type cladding layer 53, which is formed of the nitride semiconductor layer 42 of the semiconductor multilayer structure 40, has excellent crystal orientation and less dislocations. Thus, the light-emitting layer 54, the p-type cladding layer 55 and the contact layer 56 which are formed on such an n-type cladding layer 53 by epitaxial growth also have excellent crystal orientation and less dislocations. Therefore, the LED element 50 is excellent in leakage current characteristics, reliability and drive performance, etc.

The light-emitting layer 54 is composed of, e.g., three layers of multi-quantum-well structures and a 10 nm-thick GaN crystal film thereon. Each multi-quantum-well structure is composed of an 8 nm-thick GaN crystal film and a 2 nm-thick InGaN crystal film. The light-emitting layer 54 is formed by, e.g., epitaxially growing each crystal film on the n-type cladding layer 53 at a growth temperature of 750° C.

The p-type cladding layer 55 is, e.g., a 150 nm-thick GaN crystal film containing Mg at a concentration of $5.0\times10^{19}/cm^3$. The p-type cladding layer 55 is formed by, e.g., epitaxially growing a Mg-containing GaN crystal on the light-emitting layer 54 at a growth temperature of 1000° C.

The contact layer 56 is, e.g., a 10 nm-thick GaN crystal film containing Mg at a concentration of $1.5\times10^{20}/cm^3$. The contact layer 56 is formed by, e.g., epitaxially growing a Mg-containing GaN crystal on the p-type cladding layer 55 at a growth temperature of 1000° C.

For forming the buffer layer 52, the n-type cladding layer 53, the light-emitting layer 54, the p-type cladding layer 55 and the contact layer 56, it is possible to use TMG (trimethylgallium) gas as a Ga raw material, TMI (trimethylindium) gas as an In raw material, $(C_2H_5)_2SiH_2$ (diethylsilane) gas as a Si raw material, $Cp_2Mg$ (bis(cyclopentadienyl)magnesium) gas as a Mg raw material and $NH_3$ (ammonia) gas as an N raw material.

The insulating film 59 is formed of an insulating material such as $SiO_2$ and is formed by, e.g., sputtering.

The p-side electrode 57 and the n-side electrode 58 are electrodes in ohmic contact respectively with the contact layer 56 and the β-$Ga_2O_3$-based single crystal substrate 51 and are formed using, e.g., a vapor deposition apparatus.

The buffer layer 52, the n-type cladding layer 53, the light-emitting layer 54, the p-type cladding layer 55, the contact layer 56, the p-side electrode 57 and the n-side electrode 58 are formed on the β-$Ga_2O_3$-based single crystal substrate 51 (the β-$Ga_2O_3$-based single crystal substrate 1) in the form of wafer and the β-$Ga_2O_3$-based single crystal substrate 51 is then cut into chips of, e.g., 300 μm square in size by dicing, thereby obtaining the LED elements 50.

The LED element 50 is, e.g., an LED chip configured to extract light on the β-$Ga_2O_3$-based single crystal substrate 51 side and is mounted on a CAN type stein using Ag paste.

Although the LED element 50 which is a light-emitting element has been described as an example of a semiconductor element including the semiconductor multilayer structure 40 of the second embodiment, the semiconductor element is not limited thereto and may be other light-emitting elements such as laser diode or other elements such as transistor. Even when using the semiconductor multilayer structure 40 to form another element, it is also possible to obtain a high-quality element since layers formed on the semiconductor multilayer structure 40 by epitaxial growth have excellent crystal orientation and less dislocations in the same manner as the LED element 50.

Effects of the Embodiments

The inventors of the present application are the first to successfully grow an innovative high-quality β-$Ga_2O_3$-based single crystal by a new method described in the first embodiment. In the first embodiment, by processing a new high-quality β-$Ga_2O_3$-based single crystal, it is possible to obtain a β-$Ga_2O_3$-based single crystal substrate with high crystal quality which has excellent crystal orientation and less dislocations.

In the second embodiment, use of the β-$Ga_2O_3$-based single crystal substrate with high crystal quality allows high-quality films to be epitaxially grown thereon and it is thereby possible to obtain a semiconductor multilayer structure with high crystal quality.

In the third embodiment, use of the semiconductor multilayer structure with high crystal quality allows high-quality films to be epitaxially grown thereon and it is thereby possible to obtain a high-performance semiconductor element with high crystal quality.

It should be noted that the invention is not intended to be limited to the embodiments and the various kinds of modifications can be implemented without departing from the gist of the invention.

In addition, the invention according to claims is not to be limited to embodiments. Further, it should be noted that all combinations of the features described in the embodiments are not necessary to solve the problem of the invention.

What is claimed is:

1. A β-$Ga_2O_3$-based single crystal substrate, comprising a β-$Ga_2O_3$-based single crystal, wherein the β-$Ga_2O_3$-based single crystal comprises a full width at half maximum of an x-ray rocking curve of less than 75 seconds, and wherein the full width at half maximum of x-ray rocking curve is obtained at a (−201) plane or a (001) plane of the β-Ga$_2$O$_3$-based single crystal.

2. The β-Ga$_2$O$_3$-based single crystal substrate according to claim 1, wherein the full width at half maximum is not more than 35 seconds.

3. A β-Ga$_2$O$_3$-based single crystal substrate, comprising a β-Ga$_2$O$_3$-based single crystal,
wherein the β-Ga$_2$O$_3$-based single crystal comprises a full width at half maximum of an x-ray rocking curve of less than 75 seconds, and
wherein the 13-Ga$_2$O$_3$-based single crystal comprises a main surface with a plane orientation of (−201), (101) or (001).

4. The β-Ga$_2$O$_3$-based single crystal substrate according to claim 3, wherein the full width at half maximum is not more than 35 seconds.

5. A β-Ga$_2$O$_3$-based single crystal substrate, comprising an average dislocation density of less than $9 \times 10^4$ cm$^{-2}$.

6. The β-Ga$_2$O$_3$-based single crystal substrate according to claim 5, wherein the average dislocation density is not more than $7.8 \times 10^4$ cm$^{-2}$.

7. The β-Ga$_2$O$_3$-based single crystal substrate according to claim 5, further comprising a main surface with a plane orientation of (−201), (101), or (001).

8. The β-Ga$_2$O$_3$-based single crystal substrate according to claim 5, wherein the substrate is free from any twinned crystal.

9. The β-Ga$_2$O$_3$-based single crystal substrate according to claim 5, wherein the substrate further comprises a diameter of not less than 2 inches.

10. The β-Ga$_2$O$_3$-based single crystal substrate according to claim 5, further comprising a region free from any twinning plane,
wherein the region comprises a maximum width of not less than 2 inches in a direction perpendicular to an intersection line between a twinning plane and a main surface.

11. A β-Ga$_2$O$_3$-based single crystal substrate, comprising β-Ga$_2$O$_3$-based single crystal,
wherein the β-Ga$_2$O$_3$-based single crystal comprises a full width at half maximum of an x-ray rocking curve of less than 75 seconds, and
wherein the substrate is free from any twinned crystal.

12. A β-Ga$_2$O$_3$-based single crystal substrate, comprising β-Ga$_2$O$_3$-based single crystal,
wherein the β-Ga$_2$O$_3$-based single crystal comprises a full width at half maximum of an x-ray rocking curve of less than 75 seconds, and
wherein the substrate further comprises a diameter of not less than 2 inches.

13. A β-Ga$_2$O$_3$-based single crystal substrate, comprising β-Ga$_2$O$_3$-based single crystal,
wherein the β-Ga$_2$O$_3$-based single crystal comprises a full width at half maximum of an x-ray rocking curve of less than 75 seconds,
wherein the substrate further comprises a region free from any twinning plane, and
wherein the region comprises a maximum width of not less than 2 inches in a direction perpendicular to an intersection line between a twinning plane and a main surface.

* * * * *